United States Patent
Lin (10) Patent No.: US 11,685,996 B2
(45) Date of Patent: Jun. 27, 2023

(54) ATOMIC LAYER DEPOSITION DEVICE

(71) Applicant: SKY TECH INC., Hsinchu County (TW)

(72) Inventor: Jing-Cheng Lin, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 355 days.

(21) Appl. No.: 17/193,961

(22) Filed: Mar. 5, 2021

(65) Prior Publication Data
US 2022/0282373 A1 Sep. 8, 2022

(51) Int. Cl.
*C23C 16/455* (2006.01)
*C23C 16/458* (2006.01)
*C23C 16/44* (2006.01)

(52) U.S. Cl.
CPC .... *C23C 16/45544* (2013.01); *C23C 16/4412* (2013.01); *C23C 16/4586* (2013.01); *C23C 16/45502* (2013.01)

(58) Field of Classification Search
CPC ........ C23C 16/45544; C23C 16/45502; C23C 16/4586; C23C 16/4412
See application file for complete search history.

(56) References Cited

U.S. PATENT DOCUMENTS

| | | | | |
|---|---|---|---|---|
| 4,671,204 A * | 6/1987 | Ballou | ................ | H01L 21/6838 118/503 |
| 6,162,332 A * | 12/2000 | Chiu | ....................... | H01J 37/34 204/192.12 |
| 9,175,392 B2 * | 11/2015 | Satitpunwaycha | .......................... | C23C 16/45565 |
| 9,184,028 B2 * | 11/2015 | Dhindsa | ............. | H01L 21/6831 |
| 11,332,826 B1 * | 5/2022 | Lin | ..................... | C23C 16/4412 |
| 11,401,608 B2 * | 8/2022 | Lin | ..................... | C23C 16/4412 |
| 11,427,910 B2 * | 8/2022 | Lin | ..................... | C23C 16/4412 |
| 2001/0042514 A1 * | 11/2001 | Mizuno | ................... | C23C 16/54 118/728 |
| 2002/0083898 A1 * | 7/2002 | Hosokawa | .......... | C23C 16/4581 118/500 |
| 2002/0100751 A1 * | 8/2002 | Carr | ........................ | H05H 1/30 219/121.36 |
| 2004/0221808 A1 * | 11/2004 | Kawano | ............... | F16J 15/0887 118/715 |
| 2005/0134835 A1 * | 6/2005 | Kim | ....................... | G01N 21/68 356/72 |
| 2005/0208217 A1 * | 9/2005 | Shinriki | .............. | H01J 37/3244 156/345.33 |

(Continued)

FOREIGN PATENT DOCUMENTS

| CN | 112522682 A | * | 3/2021 | ......... | C23C 16/4408 |
|---|---|---|---|---|---|
| CN | 112609170 A | * | 4/2021 | ....... | C23C 16/45502 |

(Continued)

*Primary Examiner* — Jeffrie R Lund
(74) *Attorney, Agent, or Firm* — Chun-Ming Shih; HDLS IPR Services (57) ABSTRACT

An atomic layer deposition device is disclosed. The atomic layer deposition device includes a chamber, a precursor inlet, a heater, a support unit, a hollow component, and a baffle. When the heater and the support unit are driven by a lifting device to approach the hollow component, the support unit and the baffle surround and set bounds to a reaction space, so that the flow field of the process fluid, such as precursor or purge gas, can be adjusted stably to make a uniform deposition on the substrate.

20 Claims, 7 Drawing Sheets

(56) References Cited

U.S. PATENT DOCUMENTS

| | | | | |
|---|---|---|---|---|
| 2007/0089670 A1* | 4/2007 | Ikedo | .................. | C23C 16/4581 |
| | | | | 118/728 |
| 2007/0270081 A1* | 11/2007 | Crocco | .................. | B24B 37/30 |
| | | | | 451/8 |
| 2009/0239362 A1* | 9/2009 | Hirata | ................ | H01L 29/0634 |
| | | | | 118/724 |
| 2009/0283042 A1* | 11/2009 | Du | ...................... | C23C 16/4586 |
| | | | | 118/729 |
| 2010/0173432 A1* | 7/2010 | White | ................ | C23C 16/4585 |
| | | | | 118/712 |
| 2016/0054375 A1* | 2/2016 | Yamada | ............. | G01R 31/2891 |
| | | | | 324/750.2 |
| 2022/0119945 A1* | 4/2022 | Lin | .................... | C23C 16/4412 |
| 2022/0119946 A1* | 4/2022 | Lin | .................... | C23C 16/4412 |
| 2022/0282373 A1* | 9/2022 | Lin | .................... | C23C 16/4586 |

FOREIGN PATENT DOCUMENTS

| | | | | |
|---|---|---|---|---|
| CN | 214736076 U | * | 11/2021 | |
| CN | 114959644 A | * | 8/2022 | |
| JP | 2682190 B2 | * | 8/1997 | |
| JP | 2009088473 A | * | 4/2009 | ........... C23C 16/409 |
| KR | 20120012253 A | * | 2/2012 | |
| TW | M612854 U | * | 6/2021 | |
| TW | 202134462 A | * | 9/2021 | |
| TW | I750601 B | * | 12/2021 | |
| TW | 202225464 A | * | 1/2022 | |
| WO | WO-03089684 A2 | * | 10/2003 | ......... C23C 16/4412 |

\* cited by examiner

ATOMIC LAYER DEPOSITION DEVICE

TECHNICAL FIELD

This present disclosure relates to an atomic layer deposition device, more particularly, to an atomic layer deposition device that regulates the flow field of a process fluid, such as precursor or purge gas, through a reaction space which is formed by a support unit and a baffle.

BACKGROUND

The integrated circuit (IC) technology has matured, and the current development trend is to make electronic products more lightweight, high-performance, high-reliability and intelligent. The technology to miniaturize transistors of electronic products is very important. The size of the transistor is crucial to the performance of the electronic product. In electronic products, smaller transistors can reduce current transmission time and reduce energy consumption, so as to quickly calculate and achieve energy-saving effects. At present, in the tiny transistors, some of the key thin film layers are almost only a few atoms thick, and one of the techniques to develop these microstructures is the atomic layer deposition process (ALD process).

The ALD process allows the substance to be deposited layer by layer on the surface of the substrate in the form of single atoms, wherein the process allows the precursor to be chemically adsorbed on the surface of the substrate or on the material surface of the previous film, thereby producing a uniform and thin film. In the ALD process, depositing uniform thin films is an important foundation of transistor scaling and so an important topic in the development of transistors is how to effectively control the uniformity of the thin film.

At present, in the ALD process, it is still hard to effectively control the uniformity of the deposited film. One of the problems is that the flow field of the precursor is not properly controlled (for example, how to pump the precursor out of the chamber without affecting the uniformity of the substrate in the deposition process). Most ALD equipment has a large closed chamber. During the ALD process, the chamber can contain a large number of precursors, and the precursors are retained in the chamber to contact the substrate for deposition. The closed chamber can avoid the loss of precursors before the deposition and the reaction are completed. When the deposition and the reaction are complete, the precursors in the chamber are exhausted through the pumping port at the bottom of the chamber.

However, in the ALD process, if such a large closed chamber is used, the amount of precursors will be large, resulting in excessive costs. Furthermore, if the time to pump out the precursors is not well controlled, when the precursors are pumped out through a single pumping device (bottom pumping port), the precursors may not flow steadily, resulting in poor uniformity of the deposited substrate.

In order to reduce costs, one of the methods is to reduce the volume of the chamber to reduce the amount of precursors. However, this method will cause the precursors to form a turbulent flow, causing the precursors to repeatedly contact the substrate and reduce the uniformity of the substrate. Therefore, how to reduce the cost and control the uniformity of the precursor deposition on the substrate are issues to be overcome in the current ALD process.

SUMMARY

Therefore, to overcome the deficiencies in the conventional technology, an object of the present disclosure is to provide an atomic layer deposition device, which can reduce the amount of precursor used and control the precursor to form a slow flow field, so as to adjust the uniformity of a substrate when the precursor is deposited on the substrate.

It is then an object of the present disclosure to provide an atomic layer deposition device. The atomic layer deposition device includes a chamber, a precursor inlet, a heater, a support unit, a baffle, and at least one hollow component. The chamber includes a containing space. The heater is disposed in the containing space of the chamber and has a top surface. The support unit is disposed on the top surface of the heater to support a substrate. The precursor inlet is fluidly connected to the containing space of the chamber for transporting at least one precursor to the containing space. The hollow component includes at least one exhaust hole and is fluidly connected to the containing space of the chamber, wherein the hollow component is disposed above the support unit. The baffle includes a block portion and a contact portion and is disposed above the support unit and configured to surround the hollow component. The baffle is connected to the chamber or the hollow component, and the block portion is used to retain the baffle to the chamber or the hollow component when the baffle is moved downward by gravitational force.

It is another object of the present disclosure to provide an atomic layer deposition device that includes a chamber, a precursor inlet, a heater, a support unit, a baffle, a motor, and at least one hollow component. The chamber includes a containing space. The precursor inlet is fluidly connected to the containing space of the chamber for transporting at least one precursor to the containing space. The heater is disposed in the containing space of the chamber and has a top surface. The support unit is disposed on the top surface of the heater to support a substrate. The hollow component includes at least one exhaust hole and is fluidly connected to the containing space of the chamber, wherein the hollow component is disposed above the support unit. The baffle includes a block portion and a contact portion and is disposed above the support unit and configured to surround the hollow component. The motor is connected to the block portion of the baffle for driving the baffle to move vertically.

In short, the present disclosure provides an atomic layer deposition device which can pump out the precursor from the hollow component during ALD process by surrounding and setting bounds to a reaction space with the baffle and the support unit. Thus, the precursor can be reacted with and deposited on the substrate in a dynamic manner, and the uniformity of the deposition on the substrate in the atomic layer deposition process is further regulated. Therefore, the atomic layer deposition device of the present disclosure has competitive advantage in the market that requires ALD process (such as IC industry).

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
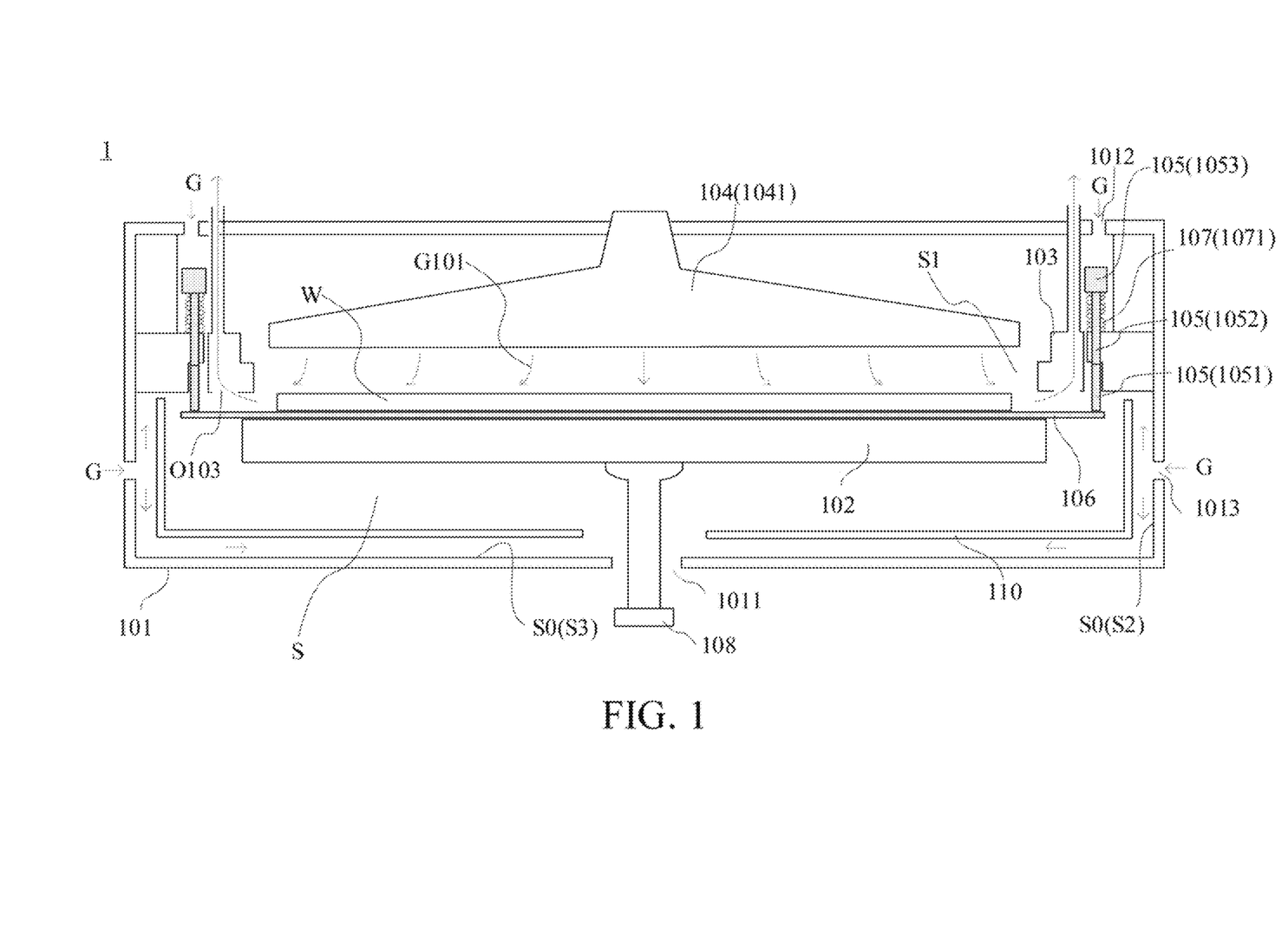
FIG. 1 is a schematic diagram of an atomic layer deposition device according to an embodiment of the present disclosure.
Figure 2:
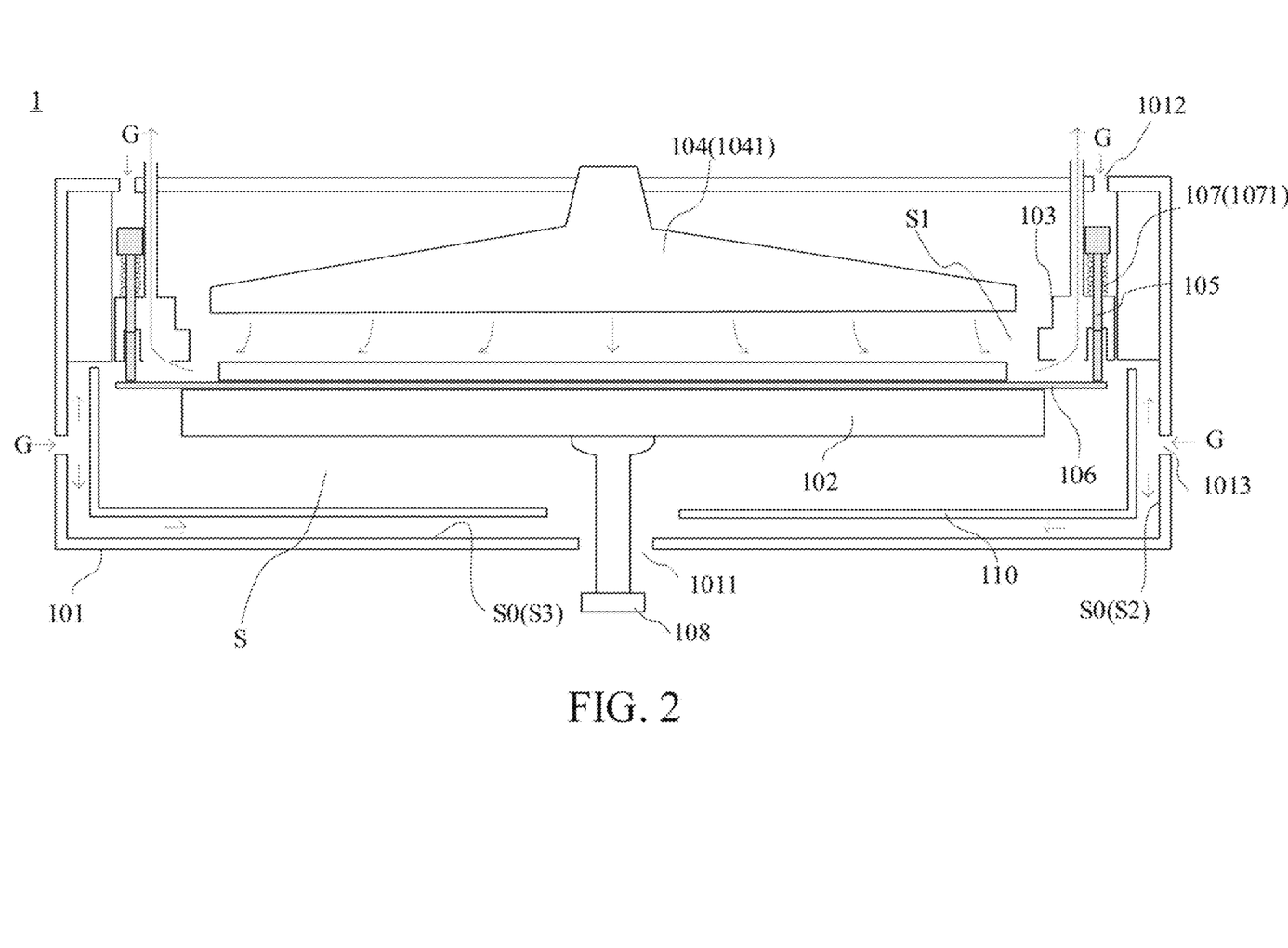
FIG. 2 is a schematic diagram of an atomic layer deposition device according to another embodiment of the present disclosure.

FIG. 1 and FIG. 2 are schematic diagrams of an atomic layer deposition device according to different embodiments of the present disclosure. Referring to FIG. 1, the atomic layer deposition device 1 has a chamber 101, a heater 102, a support unit 106, a baffle 105, at least one hollow component 103, and a precursor inlet 104. The chamber 101 has a containing space S, and the precursor inlet 104 is fluidly connected to the containing space S of the chamber 101 for transporting at least one precursor G101 to the containing space S. In other embodiments, the precursor inlet 104 is a shower head 1041, which is mounted on the top of the chamber 101 or disposed in the containing space S of the chamber 101.

The heater 102 is disposed in the containing space S of the chamber 101 and has a top surface, and the support unit 106 is disposed on the top surface of the heater 102 for supporting at least one substrate W. In one embodiment, the substrate W is a wafer.

The hollow component 103 is fluidly connected to the containing space S of the chamber 101 and is disposed above the support unit 106. The hollow component 103 has at least one exhaust hole O103. The hollow component 103 can connect to a pump (not illustrated) to pump out a fluid from the containing space S of the chamber 101, wherein the fluid may be air, purge gas, precursor, or any substance remaining in the containing space S before the process begins. In one embodiment, the exhaust hole O103 is located at the bottom of the hollow component 103, and in other embodiments, the exhaust hole O103 is located at the side of the hollow component 103.

The baffle 105 is disposed above the support unit 106 and configured to surround the hollow component 103. In specific, the baffle 105 has a block portion 1053 and a contact portion 1051, wherein the block portion 1053 is positioned above the contact portion 1051. The block portion 1053 is used to retain/limit the position of the baffle 105, ensuring that the baffle 105 does not drop to the bottom of the chamber 101 due to gravitational force. Referring to FIG. 1, in one embodiment, the baffle 105 is connected to the chamber 101, so that when the baffle 105 moves downward under gravitational force, the block portion 1053 is capable of keeping the baffle 105 to stay connected to the chamber 101 and preventing the baffle 105 from dropping and separating. More particularly, the baffle 105 may be directly connected to the chamber 101, for example, by means of securing/fastening or snap-fitting, to retain the baffle 105 to the chamber 101. Alternatively, the baffle 105 may also be indirectly connected to the chamber 101, for example, through other components to connect the baffle 105 and the chamber 101. The baffle 105 is connected to the chamber 101 at the top or the side of the chamber 101.

Referring to FIG. 2, in another embodiment, the baffle 105 is connected to the hollow component 103, and when the baffle 105 moves downward due to gravitational force, the block portion 1053 retains the baffle 105 to the hollow component 103. The baffle 105 must surround the exhaust hole O103 of the hollow component 103 to place the exhaust hole O103 in a reaction space S1.

In one embodiment, the baffle 105 further includes a buffer unit 107 disposed between the block portion 1053 and the contact portion 1051. When the baffle 105 moves downward under gravitational force, the buffer unit 107 provides buffer to the baffle 105 so that the baffle 105 moves downward slowly rather than fast, and thus the generation of dirt that is caused by quick-movement of the baffle 105 is reduced. In one embodiment, the buffer unit 107 is a spring 1071, but the present disclosure is not limited thereby.

Figure 3:
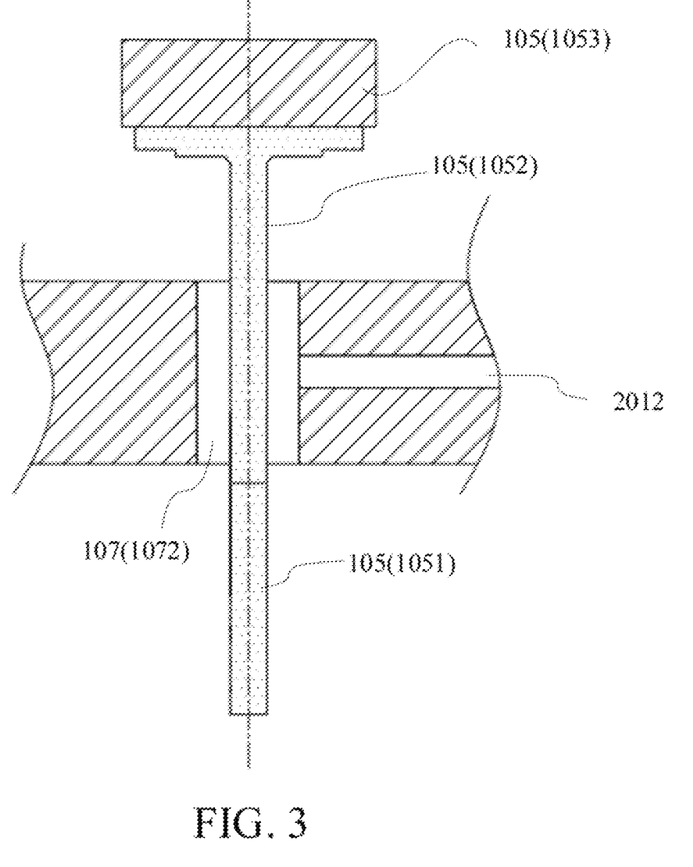
FIG. 3 is a schematic diagram of a baffle according to an embodiment of the present disclosure.

FIG. 3 is a schematic diagram of a baffle according to an embodiment of the present disclosure. Referring to FIG. 3, the baffle 105 is connected to a liner slide, and so the baffle 105 is retained between the linear slide, wherein the buffer unit 107 is a linear slid buffer unit 1072 for slowing down the speed of the baffle 105 moving downward due to gravitational force so as to reduce the chance of dirt being generated. The liner slide can be disposed at the hollow component 103 to connect the baffle 105 to the hollow component 103, or can also be connected to the chamber 101 for connecting the baffle 105 to the chamber 101.

The atomic layer deposition device 1 further includes a lifting device 108 connected to the heater 102. When the lifting device 108 drives the heater 102 and the support unit 103 toward and approach near the hollow component 103, the support unit 106 contacts the baffle 105 which is pulled down naturally by gravity, and takes/carries the baffle 105 to move vertically upward. More specifically, the support unit 106 contacts the contact portion 1051 of the baffle 105 and drives the baffle 105 to move vertically, and as such, the reaction space S1 is encircled/surrounded/formed and has its' bounds set by the baffle 105 and the support unit 106.

Figure 4:
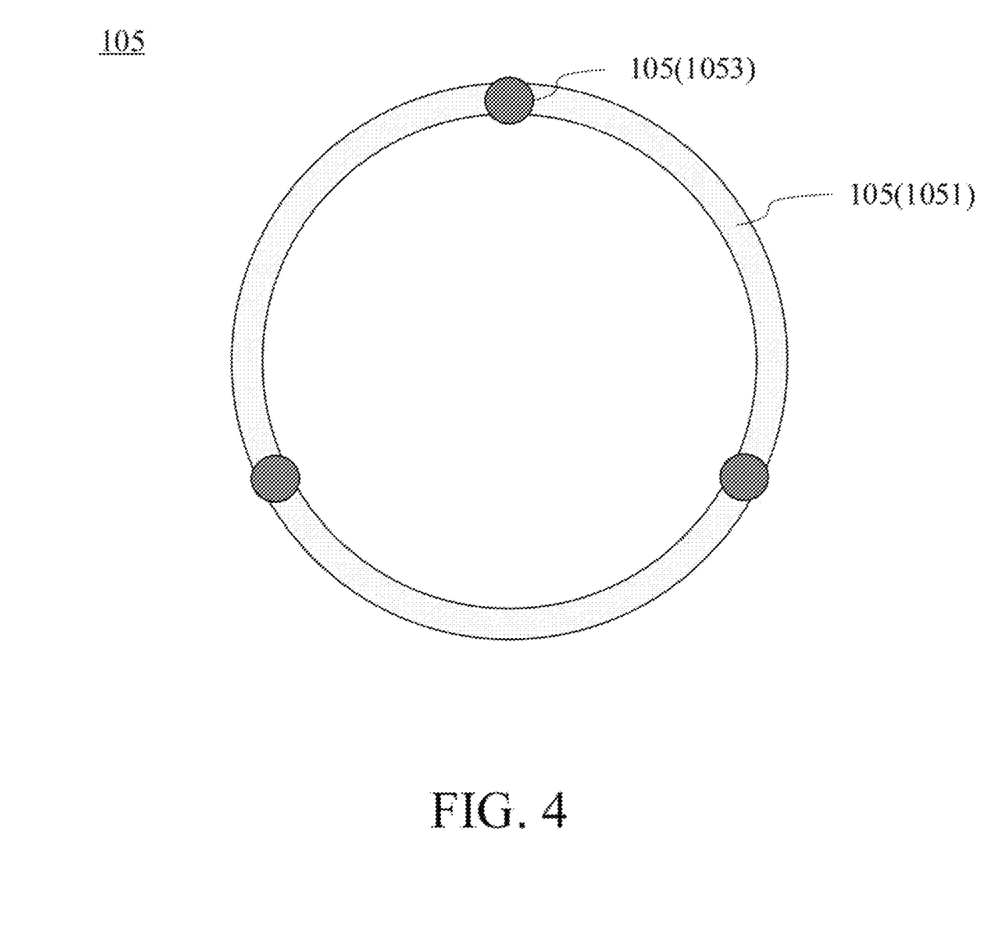
FIG. 4 is a top view of a baffle according to an embodiment of the present disclosure.
Figure 5:
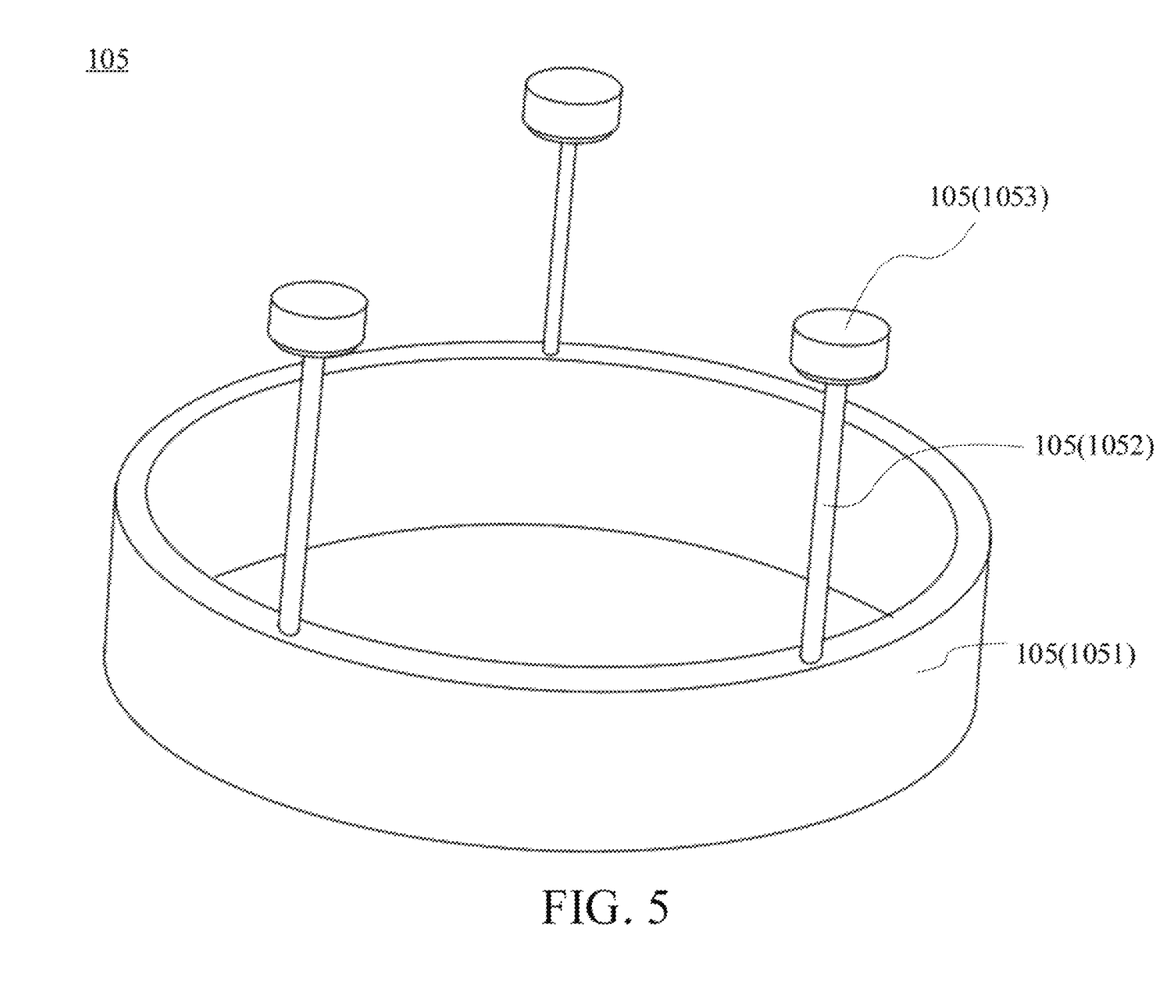
FIG. 5 is a three-dimensional schematic diagram of a baffle according to an embodiment of the present disclosure.

Referring to FIG. 4 and FIG. 5, the contact portion 1051 of the baffle 105 is an annular ring, and the baffle 105 further includes a plurality of linking rods 1052 disposed between the block portion 1053 and the contact portion 1051. The linking rods 1052 are evenly arranged and are connected to the contact portion 1051. When the lifting device 108 drives the heater 102 and the support unit 106 toward and near the hollow component 103, the support unit 106 comes in contact with the contact portion 1051 of the baffle 105 and drives the baffle 105 to move upward, and the baffle 105 becomes a side wall and, together with the support unit 106, set bounds to the reaction space S1. The precursor G101 is thereby kept in the reaction space S1 to react with the substrate W, so there is no need to provide extra precursor G101 to the chamber 101 for filling the containing space S, and hence the amount of precursor being used is saved.

By adjusting the distance between the lifting device 108 and the hollow component 103 through the lifting device 108, the size of the reaction space S1 is controlled, and the uniformity of the precursor G101 depositing on the substrate W is therefore modulated. In particular, the small space of the reaction space S1 is capable of reducing the turbulent flow of the precursor G101 and allowing the precursor G101 to be exhausted from the hollow component 103 in a slow and steady manner. Thus, the uniformity of the substrate W after precursor G101 deposition is improved.

Moreover, unlike the conventional deposition equipment which only pumps excess precursor G101 from the bottom pumping port, an upper exhaust path formed by the hollow component 103, the support unit 106, and the baffle 105 is also used for directing excess precursor G101 to be pumped/exhausted from the chamber 101. Through the structural design, the atomic layer deposition device of the present disclosure allows the excess precursor G101 to form a steady and slow flow, such that the substrate W is uniformly deposited with the precursor G101.

The atomic layer deposition device 1 further has an opening 1012 that is fluidly connected to the containing space S and is used to introduce a gas G to between the chamber 101 and the baffle 105. In specific, the gas G is a gas that does not react with the precursor G101, like nitrogen or noble gas. As shown in FIG. 1, the opening 1012 is disposed at the top of the chamber 101, and the gas G is introduced to between the chamber 101 and the baffle 105 to form an air wall and to prevent the precursor G101 from depositing on the baffle 105. In one embodiment, the gas G is introduced to between the chamber 101 and the block portion 1053 of the baffle 105 through the opening 1012, but the present disclosure is not limited thereto, the gas G can also be introduced to between the chamber 101 and the linking rods 1052 of the baffle 105, or between the chamber 101 and the contact portion 1051 of the baffle 105. In other embodiments, the opening 1012 may be disposed at the side of the chamber 101 and introduces the gas G to between the chamber 101 and the baffle 105.

In one embodiment, the atomic layer deposition device 1 further includes a pumping port 1011. The pumping port 101 is fluidly connected to the chamber 101 and is used to pump out at least one fluid from the containing space S, wherein the fluid may be air, purge gas, precursor, or any substance remaining in the containing space S before the process begins. The pumping port 1011 and the precursor inlet 104 are opposite to each other. In one embodiment, the pumping port 1011 is located at the bottom of the chamber 101 and is connected to a pump. A lower exhaust path is formed when the pumping port 1011 is pumping fluid from the chamber 101. When the pumping port 1011 and the precursor inlet 104 are arranged to face/opposite each other, the flow control over the precursor G101 or the purge gas is enhanced.

Figure 6:
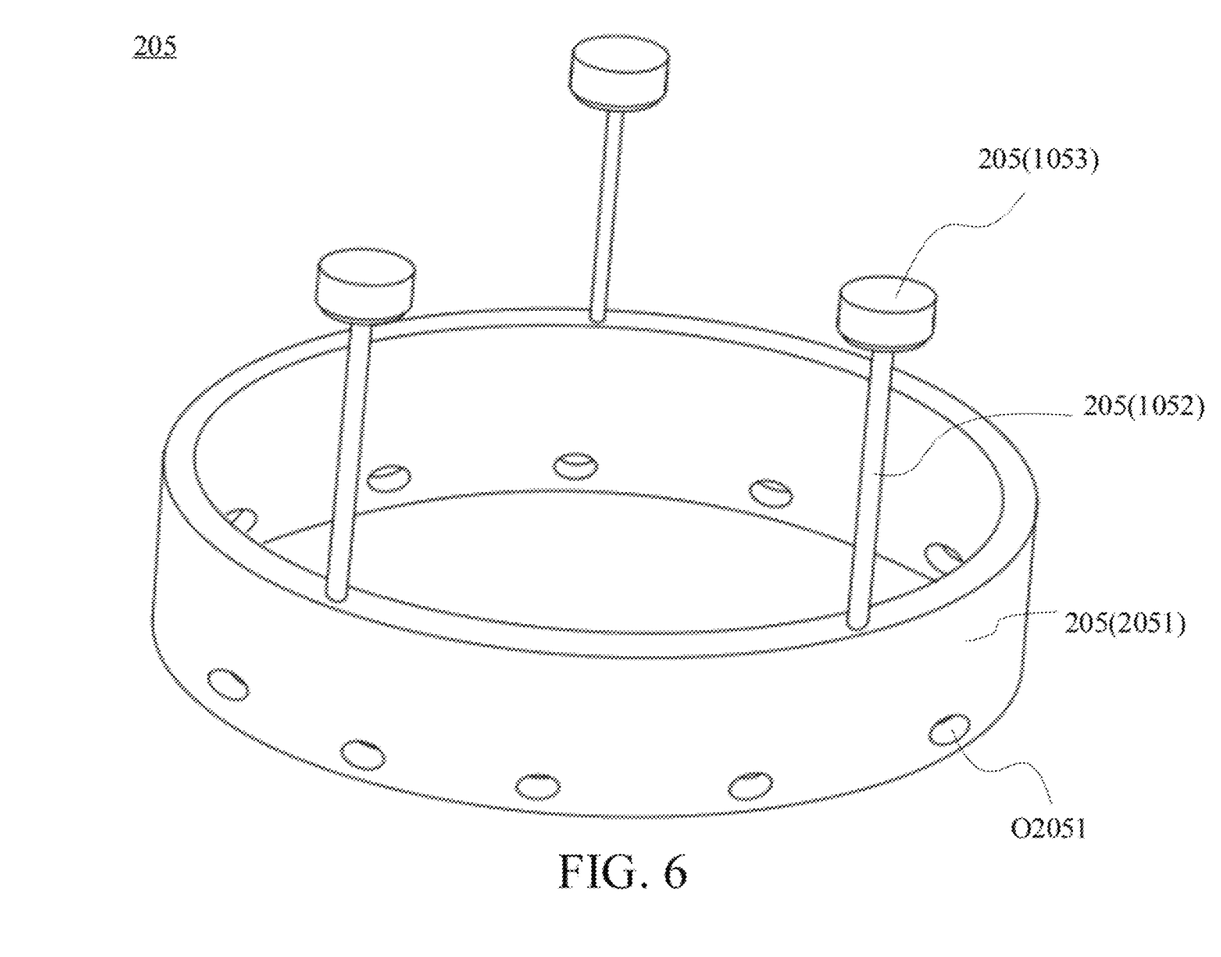
FIG. 6 is a three-dimensional schematic diagram of a baffle according to another embodiment of the present disclosure.

FIG. 6 is a schematic diagram of a baffle according to another embodiment of the present disclosure. Referring to FIG. 6, the contact portion 2051 of the baffle 205 further includes a plurality of through holes O2051 for modulating fluid flow when the pumping port 1011 pumps fluid from the containing space S. In particular, the number of and/or the size of the through holes O2051 may be varied by design to adjust the flow speed and the flow volume of the fluid being pumped through the lower exhaust path.

In one embodiment, the first step of an atomic layer deposition process is pumping fluid out of the containing space S of the chamber 101 through the pumping port 1011. The lifting device 108 drives the heater 102, the support unit 106, and the baffle 105, 205 to mover vertically upward, such that the support unit 106 and the baffle 105, 205 surround and set bounds to the reaction space S1. When the contact portion 1051 of the baffle 105 does not have the through holes O2051, the fluid in the containing space S is pumped out by the pumping port 1011 through the gap/slit between the support unit 106 and the baffle 105. When the contact portion 2051 of the baffle 205 has the through holes O2051, the fluid in the containing space S is also being pumped out by the pumping port 1011 through the through holes O2051.

Then, the precursor G101 is provided to the containing space S of the chamber 101 through the precursor inlet 104 and is diffused to and on top of the substrate W for reacting with the material on the surface of the substrate W and for deposition. After the precursor G101 introduced into the chamber 101 has reached a target amount that is determined according to process parameters, the precursor inlet 104 stops providing the precursor G101 to the chamber 101.

Subsequently, the purge gas, for example but not limited to nitrogen, is provided to the containing space S of the chamber 101 for purging the precursor G101, and at the same time, the precursor G101 is pumped from the chamber 101 through the reaction space S1 and the upper exhaust path which are formed by the hollow component 103, the support unit 106, and the baffle 105, 205.

More particularly, the precursor G101 exists mostly in the reaction space S1, and through the pump connected to the hollow component 103, the precursor G101 is slowly pumped out and has a slow flow field. Hence, the precursor G101 reacts with and deposits on the substrate W in a dynamic matter, and as such, the flow field of the purge gas can also be stably controlled.

When the precursor G101 and the purge gas flow slowly in the chamber 101, the flow field can be stably controlled and the generation of turbulent flow is prevented, so that the uniformity of the substrate W is well controlled during atomic layer deposition process.

In other embodiments, fluid is concurrently being pumped out of the containing space S of the chamber by the hollow component 103 and the pumping port 1011. In other words, prior to depositing on the substrate W, the fluid in the containing space S of the chamber 101 can be pumped out by both the pumping port 1011 and the hollow component 103 and at the same time.

Figure 7:
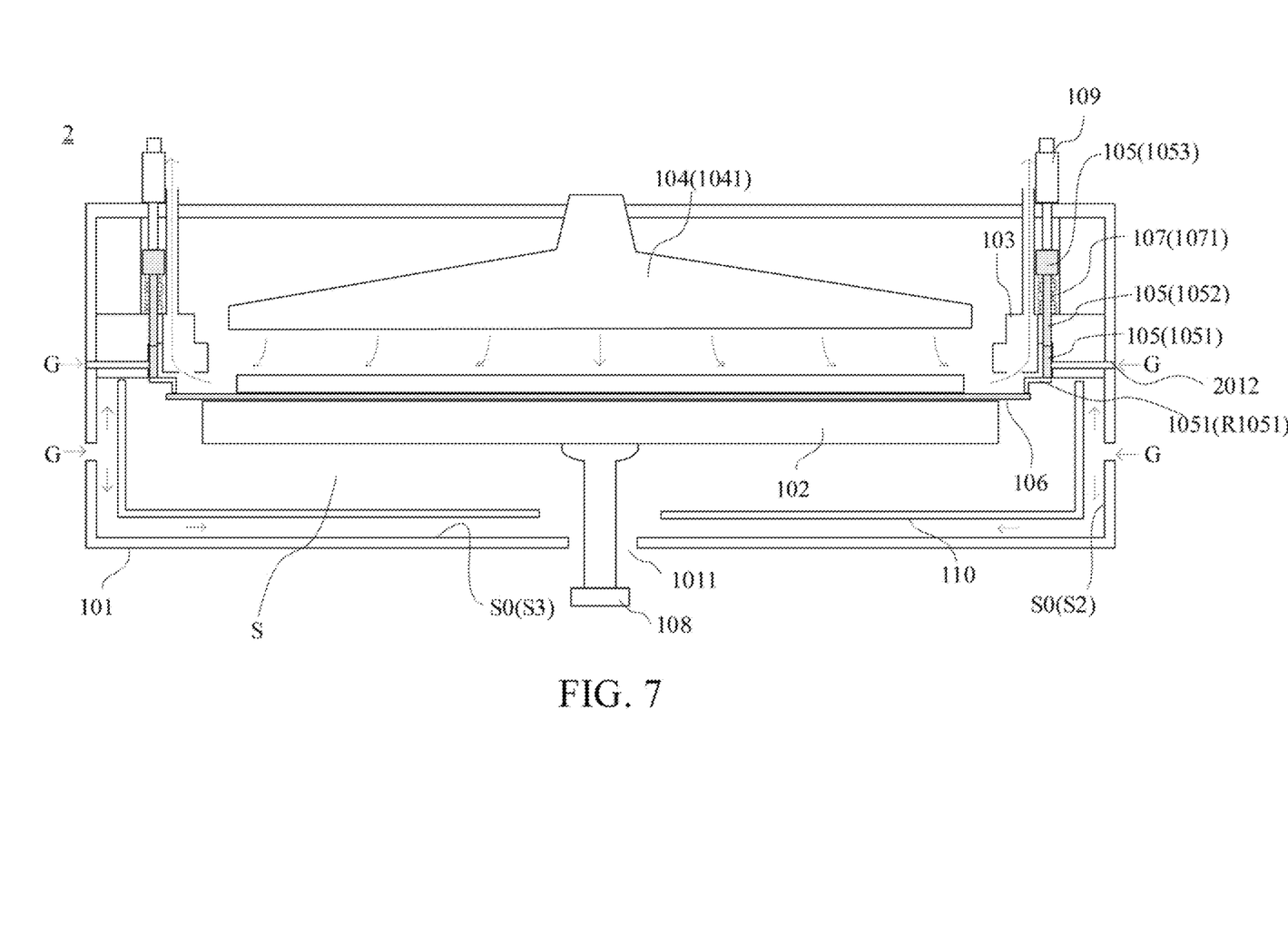
FIG. 7 is a schematic diagram of an atomic layer deposition device according to yet another embodiment of the present disclosure.

Next, referring to FIG. 7, which is a schematic diagram of an atomic layer deposition device according to another embodiment of the present disclosure, the atomic layer deposition device 2 is similar to the atomic layer deposition device 1 described in previous embodiments, and the differences are that the contact portion 1051 of the baffle 105 in the atomic layer deposition device 2 further includes a shielding ring R1051 and the atomic layer deposition device 2 further includes a motor 109.

The shielding ring R1051 is adjacent and next to the support unit 106 and is used to close off the gap between the baffle 105 and the support unit 106, so that when the reaction space S1 is surrounded by the baffle 105 and the support unit 106, the leakage of the precursor G101 through the gap between the baffle 105 and the support unit 106 is reduced. The shielding ring R1051 can also be implemented in the aforementioned embodiments. Similarly, the baffle 105 may be with or without the through holes O2051.

More specifically, the atomic layer deposition device 2 includes a chamber 101, a heater 102, a support unit 6, a baffle 105, a motor 109, at least one hollow component 103, and a precursor inlet 104. The motor 109 is connected to the baffle 105. In particular, the motor 109 is connected to the block portion 1053 of the baffle 105 and is used to drive the baffle 105 to move/displace vertically, such that the baffle 105 can also be moved by the motor 109, rather than only by gravitational force or the lifting device 108. When adjusting the position of the baffle 105 by the motor 109, the flow of the fluid in the chamber 101 can be further modulated.

In one embodiment, the opening 2012 is located at the side of the chamber 101, and the gas G is directed to between the chamber 101 and the baffle 105 and forms an air wall to prevent the precursor G101 from depositing on the baffle 105. The gas G is, for example, directed to between the chamber 101 and the contact portion 1051 of the baffle 105, but the present disclosure is not limited thereby, the gas G can also be directed to between the chamber 101 and any portion of the baffle 105. Moreover, the opening 2012 can also be located at the top of the chamber 101.

In one embodiment, the process performed by the atomic layer deposition device has the following steps. First, fluid is pumped out of the containing space S of the chamber 101 through the pumping port 1011 while the lifting device 108 drives the heater 102, the support unit 106, and the baffle 105 to move vertically upward and the motor 109 drives the baffle 105 to move vertically downward. There may be or may not be a gap between the support unit 106 and the baffle 105, and the size of the gap is controllable by adjusting the movement or driving force of the lifting device 108 and/or the motor 109, so as to adjust the flow speed and the flow volume of the fluid in the containing space S.

Next, the precursor G101 is provided to the containing space S of the chamber 101 through the precursor inlet 104 and is diffused to and on top of the substrate W to react with the material on the surface of the substrate W for deposition. The motor 109 drives the baffle 105 to move so as to adjust the flow of the precursor G101. For example, when the motor 109 drives the baffle 105 to displace and to create a gap between the support unit 106 and the baffle 105, the precursor G101 can be pumped out through the pumping port 1011. By adjusting the size of the gap, the flow volume and the flow speed of the precursor G101 are modulated.

When the precursor G101 introduced into the chamber 101 has reached a target amount that is determined according to process parameters, the precursor inlet 104 stops providing the precursor G101 to the chamber 101.

Then, the purge gas, such as nitrogen but not limited thereto, is provided to the containing space S of the chamber 101 for purging the precursor G101. At the same time, the precursor G101 in the chamber 101 is being pumped out through the reaction space S1 and the upper exhaust path, both of which are formed by the hollow component 103, the support unit 106, and the baffle 105. As well, the motor 109 drives the baffle 105 to move so as to adjust the flow of the precursor G101. For example, when the motor 109 drives the baffle to move so that there is a gap between the support unit 106 and the baffle 105, the precursor G101 can be pumped out by both the pumping port 1011 and the hollow component 103 simultaneously. The flow volume and the flow speed of the precursor G101 are modulated by adjusting the size of the gap.

Also, the precursor G101 may react with and deposit on the substrate W in a dynamic manner, and the flow field of the purge gas can be controlled stably. When the precursor G101 and the purge gas in the chamber 101 flow slowly, the flow field can be stably controlled and the generation of turbulent flow is prevented. The uniformity of the substrate W is thus well controlled during atomic layer deposition process.

Similarly, in other embodiments, the step of the hollow component 103 pumping fluid from the containing space S of the chamber 101 can be performed with the step of the pumping port 1011 pumping fluid from the containing space S of the chamber 101. In other words, prior to the step of depositing on the substrate W, the fluid in the containing space S of the chamber 101 can be exhausted or pumped out by both the hollow component 103 and the pumping port 1011 at the same time.

The atomic layer deposition device 1, 2 further includes a shielding member 110 and at least one gas inlet 1013. The shielding member 110 is disposed in the containing space S and shields a part of the inner surface S0 in the chamber 101, wherein there is a gap between the shielding member 110 and the inner surface S0 of the chamber 101, and the gap is in fluid communication with the containing space S. The gas inlet 1013 is located at the inner surface S0 of the chamber 101, and the shielding member 110 shields the gas inlet 1013, wherein the gas inlet 1013 is used to direct the gas G to between the shielding member 110 and the inner surface S0 of the chamber 101. As such, the gas G is diffused to the gap between the shielding member 110 and the chamber 101, and through the gap, further diffused to the containing space S of the chamber 101. The gas G is, for example but not limited to, nitrogen or noble gas.

In specific, the inner surface S0 includes an inner wall surface S2 and an inner bottom surface S3, and the shielding member 110 shields a part of the inner wall surface S2 and a part of the inner bottom surface S3. The gas G is directed through the gas inlet 1013 and diffused to the gap between the shielding member 110 and the inner wall surface S2, the gap between the shielding member 110 and the inner bottom surface S3 and the inner wall surface S2, and to the containing space S through the gaps.

After introducing the gas G to between the inner surface S0 of the chamber 101 and the shielding member 110 through the gas inlet 1013, the gas G flows between the inner surface S0 and the shielding member 110 and then enters the containing space S of the chamber 101 to generate positive pressure to assist most of unreacted precursor G101 to be pumped out by the pumping port 1011 and/or the hollow component 103. The remaining small amount of unreacted precursor G101 attaches to the shielding member 110 instead of to the inner surface S0 of the chamber 101, which in turn reduces the accumulation of dirt in the chamber 101 and prolongs the life expectancy of the chamber 101 as well as the clean cycle of the equipment.

The effects of the atomic layer deposition device 1, 2 and the process using the same are shown in Table 1 and Table 2. Table 1 shows the thickness of a wafer gaining a 20-nanometer thin-film deposition after the atomic layer deposition process. As shown in Table 1, the thickness uniformity of the wafer is 0.368, which is a good result after deposition. Table 2 shows the thickness of a wafer gaining a 120-nanometer thin-film deposition after the atomic layer deposition process. As shown in Table 2, the thickness uniformity of the wafer is 0.407, which is a good result after deposition.

TABLE 1

| | |
|---|---|
| Average Thickness | 19.27 nanometer |
| Uniformity (U %) | 0.368 |
| ΔThickness (ΔTHK) | 0.29 nanometer |

TABLE 2

| | |
|---|---|
| Average Thickness | 121.97 nanometer |
| Uniformity (U %) | 0.407 |
| ΔThickness (ΔTHK) | 2.38 nanometer |

In conclusion, the technical benefits of the atomic layer deposition device of the present disclosure over the conventional technology are described in the following.

In the conventional technology, in the atomic layer deposition process, a large amount of precursors are usually introduced into a large chamber to react with a substrate. Due to the large number of precursors being used, the cost is high. One conventional way to save cost is to reduce the volume of the chamber to reduce the amount of the precursors, but this method often causes the precursors to form turbulence in the chamber, resulting in poor uniformity of the substrate after deposition. On the contrary, the present disclosure provides an atomic layer deposition device that uses a reaction space formed by the hollow component, the support unit, and the baffle to save the usage of the precursors, and can form a stable, slow and uniform flow field of the precursor by pumping fluid through the hollow component to optimize the uniformity of the substrate after deposition.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

The invention claimed is:

1. An atomic layer deposition device comprising:
a chamber, comprising a containing space;
a precursor inlet, fluidly connected to the containing space of the chamber, for transporting at least one precursor to the containing space;
a heater, disposed in the containing space of the chamber and comprising a top surface;
a support, disposed on the top surface of the heater, for supporting at least one substrate;
at least one hollow component, comprising at least one exhaust hole and fluidly connected to the containing space of the chamber,
wherein the hollow component is disposed above the support; and
a baffle, disposed above the support and surrounding the hollow component, and the baffle comprising a block portion and a contact portion;
wherein the baffle is connected to the chamber or the hollow component, and when the baffle moves downward due to gravitational force, the block portion retains the baffle to the chamber or the hollow component.

2. The atomic layer deposition device of claim 1, further comprising a lifting device connected to the heater, wherein the lifting device drives the heater and the support toward the hollow component, the support contacts the contact portion of the baffle and drives the baffle to move vertically, and the baffle and the support surround and set bounds to a reaction space.

3. The atomic layer deposition device of claim 2, wherein the contact portion of the baffle further comprises a shielding ring disposed adjacent to the support for reducing a leakage of the precursor between the baffle and the support when the baffle and the support surround the reaction space.

4. The atomic layer deposition device of claim 2, wherein the baffle is connected to the hollow component and the baffle surrounds the exhaust hole of the hollow component to place the exhaust hole in the reaction space.

5. The atomic layer deposition device of claim 1, further comprising a buffer, disposed between the block portion and the contact portion of the baffle, for providing buffer to the baffle when the baffle moves downward.

6. The atomic layer deposition device of claim 5, wherein the buffer is a spring or a linear slide buffer.

7. The atomic layer deposition device of claim 1, wherein the contact portion is an annular ring, and the baffle further comprises a plurality of linking rods disposed between the block portion and the contact portion.

8. The atomic layer deposition device of claim 1, further comprising at least one opening, fluidly connected to the containing space, for introducing a gas to between the chamber and the baffle to prevent the precursor from depositing on the baffle.

9. The atomic layer deposition device of claim 1, further comprising at least one pumping port fluidly connected to the chamber for pumping at least one fluid from the containing space, wherein the pumping port and the precursor inlet are opposite to each other.

10. The atomic layer deposition device of claim 9, wherein the contact portion of the baffle further comprises a plurality of through holes for modulating a flow of the fluid being pumped out by the pumping port.

11. An atomic layer deposition device comprising:
a chamber, comprising a containing space;
a precursor inlet, fluidly connected to the containing space of the chamber, for transporting at least one precursor to the containing space;
a heater, disposed in the containing space of the chamber and comprising a top surface;
a support, disposed on the top surface of the heater, for supporting at least one substrate; at least one hollow component, comprising at least one exhaust hole and fluidly connected to the containing space of the chamber, wherein the hollow component is disposed above the support;
a baffle, disposed above the support and surrounding the hollow component, the baffle comprising a block portion and a contact portion; and
a motor, connected to the block portion of the baffle for driving the baffle to move vertically.

12. The atomic layer deposition device of claim 11, further comprising a lifting device connected to the heater, wherein the lifting device drives the heater and the support toward the hollow component, and the baffle and the support surround and set bound to a reaction space.

13. The atomic layer deposition device of claim 12, wherein the contact portion of the baffle further comprises a shielding ring disposed adjacent to the support for reducing a leakage of the precursor between the baffle and the support when the baffle and the support surround the reaction space.

14. The atomic layer deposition device of claim 12, wherein the baffle is connected to the hollow component and the baffle surrounds the exhaust hole of the hollow component to place the exhaust hole in the reaction space.

15. The atomic layer deposition device of claim 11, further comprising a buffer, disposed between the block portion and the contact portion of the baffle, for providing buffer to the baffle when the baffle moves vertically downward.

16. The atomic layer deposition device of claim 15, wherein the buffer is a spring or a linear slide buffer.

17. The atomic layer deposition device of claim 11, wherein the contact portion is an annular ring, and the baffle further comprises a plurality of linking rods disposed between the block portion and the contact portion.

18. The atomic layer deposition device of claim 11, further comprising at least one opening, fluidly connected to the containing space, for introducing a gas to between the chamber and the baffle to prevent the precursor from depositing on the baffle.

19. The atomic layer deposition device of claim 11, further comprising at least one pumping port, fluidly connected to the chamber for pumping at least one fluid from the containing space, wherein the pumping port and the precursor inlet are opposite to each other.

20. The atomic layer deposition device of claim 19, wherein the contact portion of the baffle further comprises a plurality of through holes for modulating a flow of the fluid being pumped out by the pumping port.

\* \* \* \* \*